(12) United States Patent
Ozaki et al.

(10) Patent No.: US 7,417,274 B2
(45) Date of Patent: Aug. 26, 2008

(54) SEMICONDUCTOR DEVICE INCLUDING DIRECT CONTACT BETWEEN CAPACITOR ELECTRODE AND CONTACT PLUG AND METHOD OF MANUFACTURING THE SAME

(75) Inventors: Tohru Ozaki, Tokyo (JP); Yoshinori Kumura, Yokohama (JP); Yoshiro Shimojo, Yokohama (JP); Susumu Shuto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 120 days.

(21) Appl. No.: 11/491,907

(22) Filed: Jul. 25, 2006

(65) Prior Publication Data
US 2007/0054462 A1 Mar. 8, 2007

(30) Foreign Application Priority Data
Sep. 7, 2005 (JP) ............................. 2005-259420

(51) Int. Cl.
*H01L 27/108* (2006.01)
(52) U.S. Cl. .................. 257/295; 257/532; 438/393
(58) Field of Classification Search ............. 257/295, 257/532; 438/393
See application file for complete search history.

(56) References Cited

U.S. PATENT DOCUMENTS 6,590,252 B2 * 7/2003 Kutsunai et al. ............ 257/310
7,151,288 B2 * 12/2006 Imai et al. ................... 257/295

FOREIGN PATENT DOCUMENTS

JP 2004-6593 1/2004

* cited by examiner

*Primary Examiner*—Zandra Smith
*Assistant Examiner*—Paul E Patton
(74) *Attorney, Agent, or Firm*—Oblon, Spivak, McClelland, Maier & Neustadt, P.C.

(57) ABSTRACT

A semiconductor device comprises an insulation film that is provided on a semiconductor substrate, a first contact plug that is provided in the insulation film and includes a metal, a first adhesive film that is provided on the insulation film, has a higher oxygen affinity than the metal, and includes an oxide, a second adhesive film that is provided on the first contact plug and has a film thickness that is smaller than a film thickness of the first adhesive film, a first capacitor electrode that is provided on the contact plug and the first adhesive film, has a part in direct contact with the first contact plug, a capacitor insulation film that is provided on the first capacitor electrode, and a second capacitor electrode that is provided on the capacitor insulation film.

9 Claims, 4 Drawing Sheets $(1nm \leq D1 \leq 10nm, D1 \geq D2, 40nm \leq D3 \leq 200nm)$

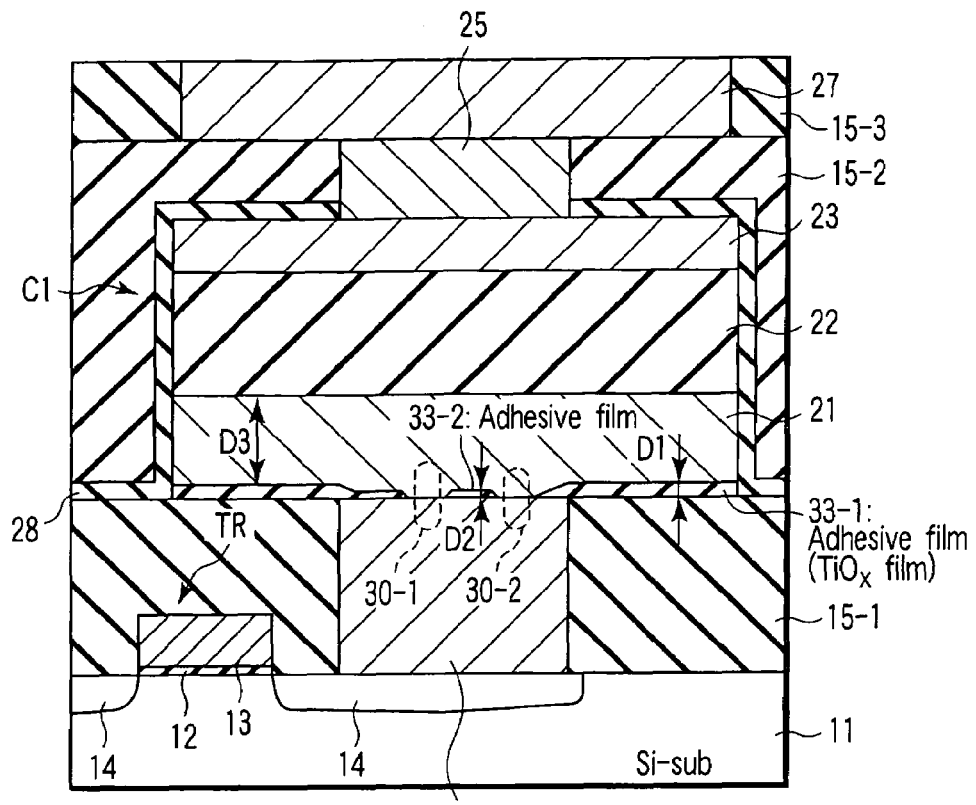
FIG. 1  (1nm≦D1≦10nm, D1≧D2, 40nm≦D3≦200nm)
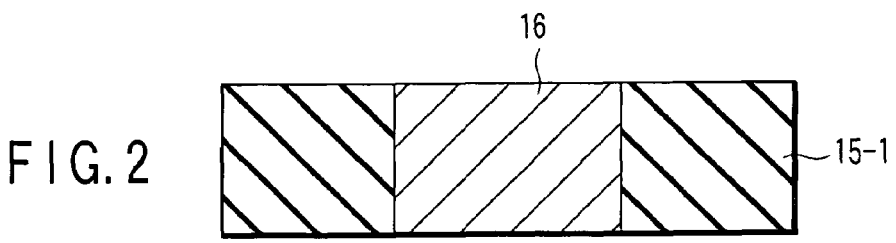
FIG. 2
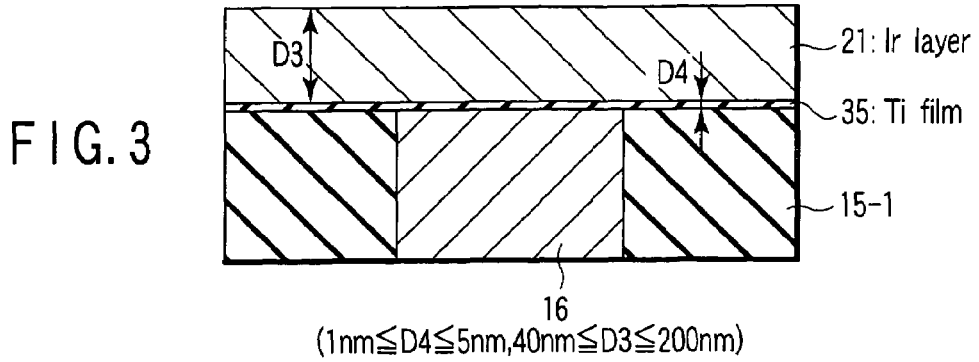
FIG. 3  (1nm≦D4≦5nm, 40nm≦D3≦200nm)

SEMICONDUCTOR DEVICE INCLUDING DIRECT CONTACT BETWEEN CAPACITOR ELECTRODE AND CONTACT PLUG AND METHOD OF MANUFACTURING THE SAME

CROSS-REFERENCE TO RELATED APPLICATIONS

This application is based upon and claims the benefit of priority from prior Japanese Patent Application No. 2005-259420, filed Sep. 7, 2005, the entire contents of which are incorporated herein by reference.

BACKGROUND OF THE INVENTION

1. Field of the Invention

The present invention relates generally to a semiconductor device and a method of manufacturing the semiconductor device, and is applicable, for example, to an FeRAM (Ferroelectric Random Access Memory).

2. Description of the Related Art

In recent years, attention has been paid to an FeRAM using a ferroelectric capacitor as one of nonvolatile semiconductor memories.

The ferroelectric memory device adopts a so-called COP (Capacitor On Plug) capacitor structure, from the standpoint of an area penalty, wherein electric connection between a capacitor electrode and a source/drain of a transistor is realized by a conductive contact plug (see Jpn. Pat. Appln. KOKAI Publication No. 2004-6593, for instance). In addition, from the standpoint of adhesion of the capacitor electrode, an adhesive film of a metal such as Ti (titanium) is, in usual cases, provided at an interface of the capacitor electrode.

However, with an increasing demand for finer microfabrication, there is a need to decrease the thickness of an Ir (Iridium) film of the capacitor electrode, which also functions as an oxygen diffusion prevention film. If a recovery anneal step in an oxidizing atmosphere for recovering damage in a capacitor forming step, or another heat treatment step in an oxidizing atmosphere is performed with the thickness of the capacitor electrode being thin, the capacitor electrode would fail to sufficiently suppress diffusion of oxygen, resulting in leakage of a slight amount of oxygen from the capacitor electrode.

The oxygen that leaks out may oxidize the adhesive film, and an oxidized adhesive film (TiOx film) may continuously form between the contact plug and the capacitor electrode. Consequently, direct contact would be lost between the capacitor electrode and the contact plug, and the conductivity between the capacitor electrode and the contact plug is degraded.

BRIEF SUMMARY OF THE INVENTION

According to an aspect of the present invention, there is provided a semiconductor device comprising: an insulation film that is provided on a semiconductor substrate; a first contact plug that is provided in the insulation film and includes a metal; a first adhesive film that is provided on the insulation film, has a higher oxygen affinity than the metal, and includes an oxide; a second adhesive film that is provided on the first contact plug and has a film thickness that is smaller than a film thickness of the first adhesive film; a first capacitor electrode that is provided on the contact plug and the first adhesive film, has a part in direct contact with the first contact plug; a capacitor insulation film that is provided on the first capacitor electrode; and a second capacitor electrode that is provided on the capacitor insulation film.

According to another aspect of the present invention, there is provided a method of manufacturing a semiconductor device, comprising: forming an insulation film; forming a contact hole in the insulation film; filling a metal in the contact hole, thus forming a contact plug; forming a metallic film on the insulation film and the contact plug, the metallic film having a higher oxygen affinity than the metal and having a film thickness that is between 1 nm and 5 nm; forming a first capacitor electrode on the metallic film; forming a ferroelectric film on the first capacitor electrode; performing heat treatment in an oxidizing atmosphere, crystallizing the ferroelectric film to form a capacitor insulation film, forming a first adhesive film on the insulation film by reacting the metallic film with oxygen, and forming a second adhesive film on the contact plug by reacting the metallic film with oxygen such that the first capacitor electrode and the contact plug have at least one direct contact; and forming a second capacitor electrode on the capacitor insulation film.

According to still another aspect of the present invention, there is provided a method of manufacturing a semiconductor device, comprising: forming an insulation film; forming a contact hole in the insulation film; filling a metal in the contact hole, thus forming a contact plug; forming a metallic film on the insulation film and the contact plug, the metallic film having a higher oxygen affinity than the metal and having a film thickness of 1 nm; forming a first capacitor electrode on the metallic film; forming a ferroelectric film on the first capacitor electrode; performing heat treatment in an oxidizing atmosphere, crystallizing the ferroelectric film to form a capacitor insulation film, forming a first adhesive film on the insulation film by reacting the metallic film with oxygen, and forming a direct contact between the first capacitor electrode and the contact plug; and forming a second capacitor electrode on the capacitor insulation film.

BRIEF DESCRIPTION OF THE SEVERAL VIEWS OF THE DRAWING

FIG. 1 is a cross-sectional view that shows a semiconductor device according to a first embodiment of the present invention;

FIG. 2 is a cross-sectional view that illustrates a fabrication step of the semiconductor device according to the first embodiment of the invention;

FIG. 3 is a cross-sectional view that illustrates a fabrication step of the semiconductor device according to the first embodiment of the invention;

DETAILED DESCRIPTION OF THE INVENTION

Figure 4:
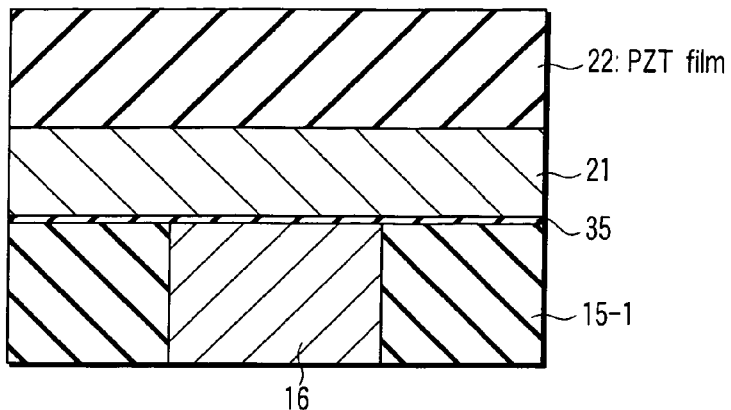
FIG. 4 is a cross-sectional view that illustrates a fabrication step of the semiconductor device according to the first embodiment of the invention.

Embodiments of the present invention will now be described with reference to the accompanying drawings. In the description below, common structural parts are denoted by like reference numerals throughout the drawings.

First Embodiment

A semiconductor device according to an embodiment of the invention is described referring to FIG. 1. FIG. 1 is a cross-sectional view that shows the semiconductor device according to the embodiment.

As is shown in FIG. 1, a transistor TR is provided on a silicon substrate 11, and a ferroelectric capacitor C1 is provided in an interlayer insulation film 15-2.

The transistor TR comprises a gate insulation film 12 that is provided on the substrate 11, a gate electrode 13 that is provided on the gate insulation film 12, and source/drain regions 14 that are provided spaced part in the substrate 11 such that the gate electrode 13 is interposed between the source/drain regions 14.

The ferroelectric capacitor C1 comprises adhesive films 33-1 and 33-2, a lower capacitor electrode 21, a capacitor insulation film 22, an upper capacitor electrode 23, and a barrier film 28.

A lower contact plug 16 is provided in an interlayer insulation film 15-1. The lower contact plug 16 is mainly formed of a metal such as W (tungsten) (i.e. the content of the metal is 50% or more). The lower contact plug 16 electrically connects the source/drain 14 and the lower capacitor electrode 21.

The adhesive film 33-1 is provided on the interlayer insulation film 15-1. The adhesive film 33-1 is an insulating film that has a higher oxygen affinity than the metal (W), which is the main ingredient of the lower contact plug 16, and is mainly formed of an oxide. Specifically, the adhesive film 33-1 is formed of, e.g. TiOx (titanium oxide) and has a film thickness D1 that is between 1 nm and 10 nm. The oxygen affinity, in this context, means the degree of bondability to oxygen.

The adhesive film 33-2 is provided on the lower contact plug 16 and has a film thickness D2 that is less than the film thickness D1 of the adhesive film 33-1. Specifically, the film thickness D2 of the adhesive film 33-2 is about half the film thickness D1.

The lower capacitor electrode 21 is provided on the lower contact plug 16 and the adhesive films 33-1 and 33-2. The lower capacitor electrode 21 also functions to prevent diffusion of oxygen into the adhesive films 33-1 and 33-2 in a heat treatment step. The lower capacitor electrode 21 is formed of, e.g. an Ir (iridium) film.

The lower capacitor electrode 21 and lower contact plug 16 have direct contacts 30-1 and 30-2.

The capacitor insulation film 22 is provided on the lower capacitor electrode 21 and is formed of a ferroelectric material such as PZT ($PbZr_xTi_{1-x}O_3$).

The upper capacitor electrode 23 is provided on the capacitor insulation film 22 and is formed of, e.g. Pt (platinum).

The barrier film 28 is provided so as to cover the side surfaces and upper surface of the ferroelectric capacitor C1, and prevents a so-called hydrogen attack by diffusion of, e.g. H (hydrogen) gas.

An upper contact plug 25, which is electrically connected to the upper capacitor electrode 23, is provided in the interlayer insulation film 15-2. The upper contact plug 25 is formed of a metal such as W or Al (aluminum).

A wiring layer 27, which is electrically connected to the upper contact plug 25, is provided in an interlayer insulation film 15-3. The wiring layer 27 functions, for example, as a so-called plate line, and is formed of a metal such as Al or Cu (copper).

The interlayer insulation films 15-1 to 15-3 are formed of low-dielectric-constant films (so-called Low-k films) such as SiOC films.

Next, a method of manufacturing the semiconductor device according to this embodiment is described with reference to FIG. 2 to FIG. 8, taking the semiconductor device shown in FIG. 1 by way of example. In the description below, depiction of the transistor TR on the substrate 11 is omitted.

To start with, a transistor TR is formed on the semiconductor substrate 11 by conventional fabrication steps (not illustrated).

As is shown in FIG. 2, an SiOC film, for instance, is deposited over the transistor TR by means of, e.g. CVD (Chemical Vapor Deposition), thus forming an interlayer insulation film 15-1. Then, that part of the interlayer insulation film 15-1, which is located on the source/drain 14 of the transistor TR, is etched away by, e.g. RIE (Reactive Ion Etching), until the surface of the substrate 11 is exposed. Thus, a contact hole is formed. Using, e.g. sputtering, a W (tungsten) film, for instance, is deposited within the contact hole. Subsequently, the W film is polished by, e.g. CMP (Chemical Mechanical Polishing), so that the surface of the W film and the surface of the interlayer insulation film 15-1 are planarized. Thus, the W film is buried in the contact hole, and a lower contact plug 16 is formed.

As is shown in FIG. 3, a Ti (titanium) film 35, which has a film thickness D4 controlled at 1 nm to 5 nm (e.g. about 4 nm), is formed on the interlayer insulation film 15-1 and lower contact plug 16 by means of, e.g. sputtering. On the Ti film 35, an Ir (iridium) film, for instance, is deposited by means of, e.g. sputtering, and thus a lower capacitor electrode 21 is formed. From the standpoint of prevention of oxygen diffusion, it is desirable that a thickness D3 of the lower capacitor electrode 21 that is formed in this step be set at, e.g. about 40 nm to 200 nm. In addition, the lower capacitor electrode 21 may not be a single layer of the Ir film, but may be a stacked layer comprising the Ir film and a metal film such as an $IrO_2$ film, a Pt film or an $SrRu_xO_y$ film. In the case of using the stacked layer, it is desirable to position the Ir film immediately on the Ti film 35.

As is shown in FIG. 4, a ferroelectric film, such as a PZT film, is deposited on the lower capacitor electrode 21 by means of, e.g. sputtering or MOCVD, thus forming a capacitor insulation film 22.

Figure 5:
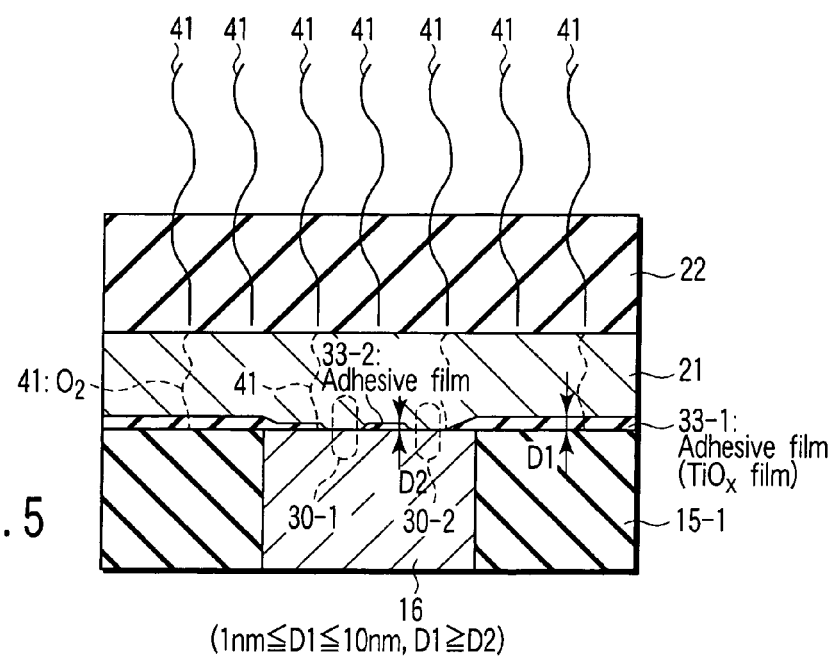
FIG. 5 is a cross-sectional view that illustrates a fabrication step of the semiconductor device according to the first embodiment of the invention.

Subsequently, as shown in FIG. 5, the capacitor insulation film 22 is crystallized to have enhanced orientation in an anneal (heat treatment) step in an $O_2$ (oxygen) atmosphere. For example, it is desirable to perform the anneal step in an $O_2$ atmosphere at about 400° C. to 700° C. for about 10 minutes to 1 hour using a diffusion furnace, or in an $O_2$ atmosphere at about 400° C. to 800° C. for about 10 seconds to 120 seconds using an RTP apparatus.

In the heat treatment step, the Ti film 35 on the interlayer insulation film 15-1 is hardly movable. Thus, the Ti film 35 is oxidized by oxygen 41, which leaks from the capacitor electrode 21, and becomes an oxide film (TiOx film) that is, an adhesive film 33-1 with a film thickness D1 of 1 nm to 10 nm. The reason why the Ti film 35 on the interlayer insulation film 15-1 is hardly movable is that the oxide film (TiOx film) is formed at the interface with the interlayer insulation film 15-1 immediately after the formation of the Ti film 35.

On the other hand, the Ti film 35 on the lower contact plug 16 is easily movable. Thus, due to the heat that is produced in this heat treatment step, the Ti film 35 diffuses into the capacitor electrode 21 to form portions 30-1 and 30-2, or moves over the lower contact plug 16 and is oxidized into an insular oxide film (TiOx film) and becomes the adhesive film 33-2. The reason why the Ti film 35 on the lower contact plug 16 is easily movable is that the contact plug 16 is mainly formed of a metal and contains a small quantity of oxygen that causes oxidation, and an oxide film (TiOx film) is not formed at the interface with the contact plug 16.

Since the Ti film 35 with the film thickness D4 that is controlled at 1 nm to 5 nm is formed in advance and the above-described heat treatment step is performed, the portions (direct contacts) 30-1, 30-2 where the capacitor electrode 21 directly contacts the contact plug 16 are formed.

Figure 6:
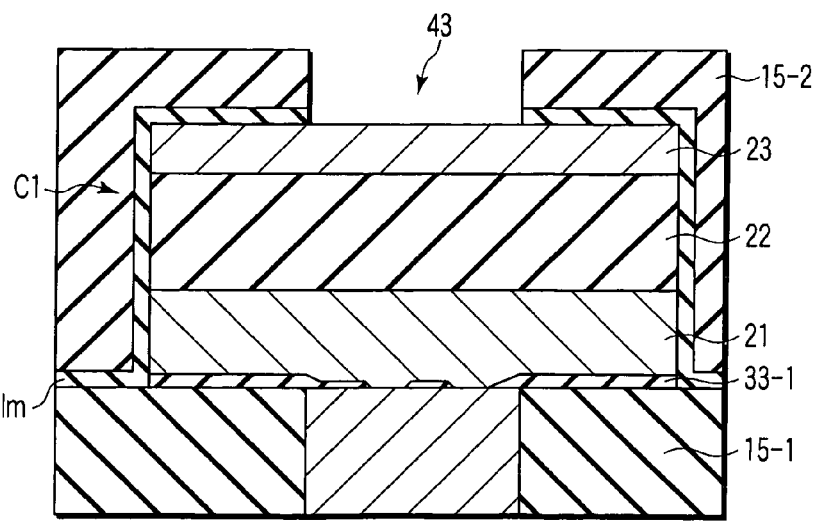
FIG. 6 is a cross-sectional view that illustrates a fabrication step of the semiconductor device according to the first embodiment of the invention.

Subsequently, as shown in FIG. 6, a Pt layer, an IrO$_2$ layer or a SrRu$_X$O$_Y$ layer, for instance, is deposited on the capacitor insulation film 22 by, e.g. CVD, thus forming an upper capacitor electrode 23. Then, anisotropic etching such as RIE is performed down to the surface of the interlayer insulation film 15, thereby isolating the capacitor electrode 23, capacitor insulation film 22, capacitor electrode 21 and adhesive film 33-1 and forming a capacitor structure.

Further, an alumina film, for instance, is deposited by, e.g. CVD, so as to cover the side surfaces and upper surface of the capacitor structure, thus forming a barrier film 28. A SiOC film, for instance, is deposited by, e.g. CVD, over the barrier film 28, thus forming an interlayer insulation film 15-2. Then, anisotropic etching such as RIE is performed to form an opening portion 43 that penetrates the interlayer insulation film 15-2 and barrier film 28 and exposes the surface of the upper capacitor electrode 23.

Figure 7:
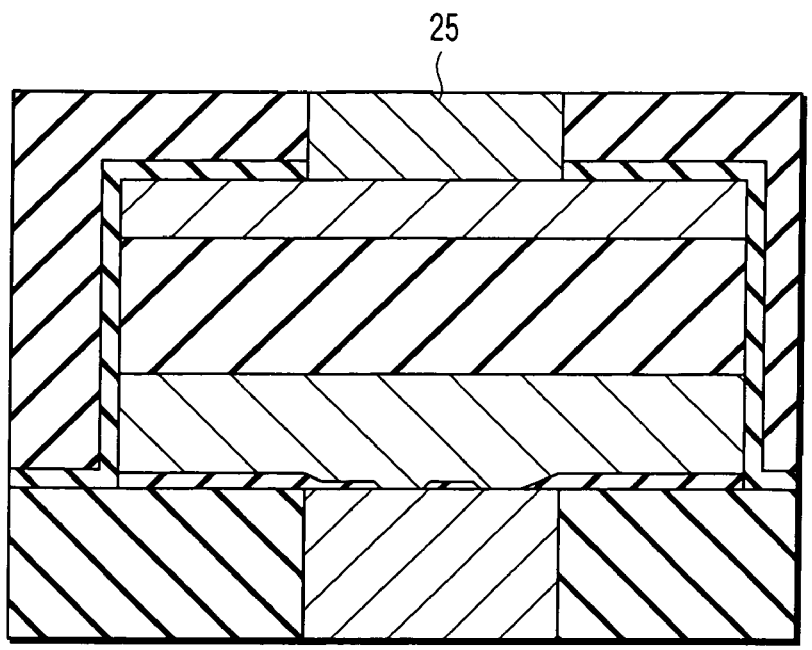
FIG. 7 is a cross-sectional view that illustrates a fabrication step of the semiconductor device according to the first embodiment of the invention.

Following the above, as shown in FIG. 7, a W (tungsten) layer, for instance, is deposited by, e.g. CVD, on the interlayer insulation film 15-1, the side walls of the opening portion 43 and the upper capacitor electrode 23. Further, CMP, for instance, is performed to perform planarization down to the surface of the interlayer insulation film 15-2, thereby burying the W layer in the opening portion 43 and forming an upper contact plug 25. Prior to depositing the W layer, it is possible to deposit a TiN film, for instance, thereby forming a barrier metal film. Besides, by burying an Al layer in the opening portion 43, it is possible to form the upper contact plug 25.

Figure 8:
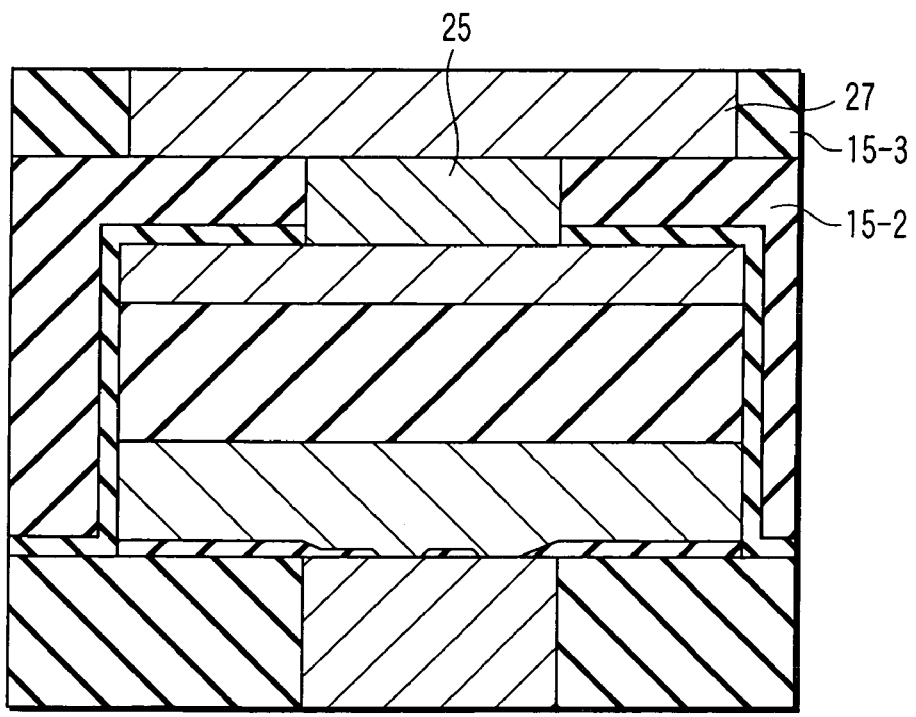
FIG. 8 is a cross-sectional view that illustrates a fabrication step of the semiconductor device according to the first embodiment of the invention.

As is shown in FIG. 8, a SiOC layer, for instance, is deposited by, e.g. CVD, on the interlayer insulation film 15-2 and the upper contact plug 25, thereby forming an interlayer insulation film 15-3. Further, anisotropic etching such as RIE is performed to form an opening portion that penetrates the interlayer insulation film 15-3 and exposes the surface of the upper capacitor electrode 25. Thereafter, a Cu layer or an Al layer, for instance, is deposited by, e.g. sputtering, in this opening portion, thereby burying the Cu layer or Al layer in the opening portion and forming a wiring layer 27. Alternatively, the wiring layer 27 may be formed of an Al—Cu alloy layer after a barrier metal film of a stacked structure of Ti film/TiN film is formed in the opening portion. By the above-described manufacturing method, the semiconductor device shown in FIG. 1 is fabricated.

The semiconductor device and the manufacturing method thereof according to the present embodiment have the following advantageous effects (1) to (4).

(1) The conductivity between the capacitor electrode 21 and contact plug 16 can be enhanced while adhesion between the capacitor electrode 21 and interlayer insulation film 15-1 is secured.

As has been described above, the Ti (titanium) film 35, which has a film thickness D4 controlled at 1 nm to 5 nm (e.g. about 4 nm), is formed. Subsequently, the capacitor insulation film 22 is crystallized to have enhanced orientation in the anneal (heat treatment) step in the O$_2$ (oxygen) atmosphere.

In the heat treatment step, the Ti film 35 on the interlayer insulation film 15-1 is hardly movable. Thus, the Ti film 35 is oxidized by oxygen, which leaks from the capacitor electrode 21, and becomes the oxide film (TiOx film). Thereby, that the continuous adhesive film 33-1 with a film thickness D1 of 1 nm to 10 nm can be formed. The reason why the Ti film 35 on the interlayer insulation film 15-1 is hardly movable is that the oxide film (TiOx film) is formed at the interface with the interlayer insulation film 15-1 immediately after the formation of the Ti film 35.

The continuous adhesive film 33-1 is formed between the capacitor electrode 21 and interlayer insulation film 15-1, and the adhesion between the capacitor electrode 21 and interlayer insulation film 15-1 can advantageously be enhanced.

On the other hand, in this heat treatment step, the Ti film 35 on the lower contact plug 16 is easily movable. Thus, the Ti film 35 diffuses into the capacitor electrode 21 to form portions 30-1 and 30-2 (direct contacts), or moves over the lower contact plug 16 and is oxidized into an insular oxide film (TiOx film) and becomes the adhesive film 33-2 whose film thickness D2 is about half the film thickness D1. The reason why the Ti film 35 on the lower contact plug 16 is easily movable is that the contact plug 16 is mainly formed of a metal and contains a small quantity of oxygen that causes oxidation, and an oxide film (TiOx film) is not formed at the interface with the contact plug 16.

The Ti film 35 with the film thickness D4 that is controlled at 1 nm to 5 nm is formed in advance and the above-described heat treatment step is performed. Thereby, the portions 30-1 and 30-2 at which the Ti film 35 is absent can stably be formed. As a result, the direct contacts 30-1 and 30-2 where the capacitor electrode 21 directly contacts the contact plug 16 can be formed, and the conductivity between the capacitor electrode 21 and contact plug 16 can advantageously be enhanced.

(2) The capacitance value of the ferroelectric capacitor C1 can advantageously be increased.

As has been described above, the anneal (heat treatment) step is performed in the O$_2$ (oxygen) atmosphere to crystallize the capacitor insulation film 22 and to enhance the orientation. In addition, the polarization amount of the capacitor insulation film 22 can be increased. Thus, the capacitance value of the ferroelectric capacitor C1 can advantageously be increased.

(3) Microfabrication can advantageously be performed.

As has been described above, since the direct contacts 30-1 and 30-2 can be formed, the thickness D3 of the capacitor electrode 21, which also functions as the oxygen diffusion prevention film, can further be reduced (e.g. D3 is about 40 nm to 200 nm).

Therefore, the area occupied by the capacitor electrode 21 can be reduced, and microfabrication can advantageously be performed.

(4) The manufacturing cost can advantageously be reduced.

The advantageous effects (1) and (2) can be obtained by the single heat treatment step. Since the number of fabrication step is not increased, the manufacturing cost can advantageously be reduced.

Second Embodiment

Figure 9:
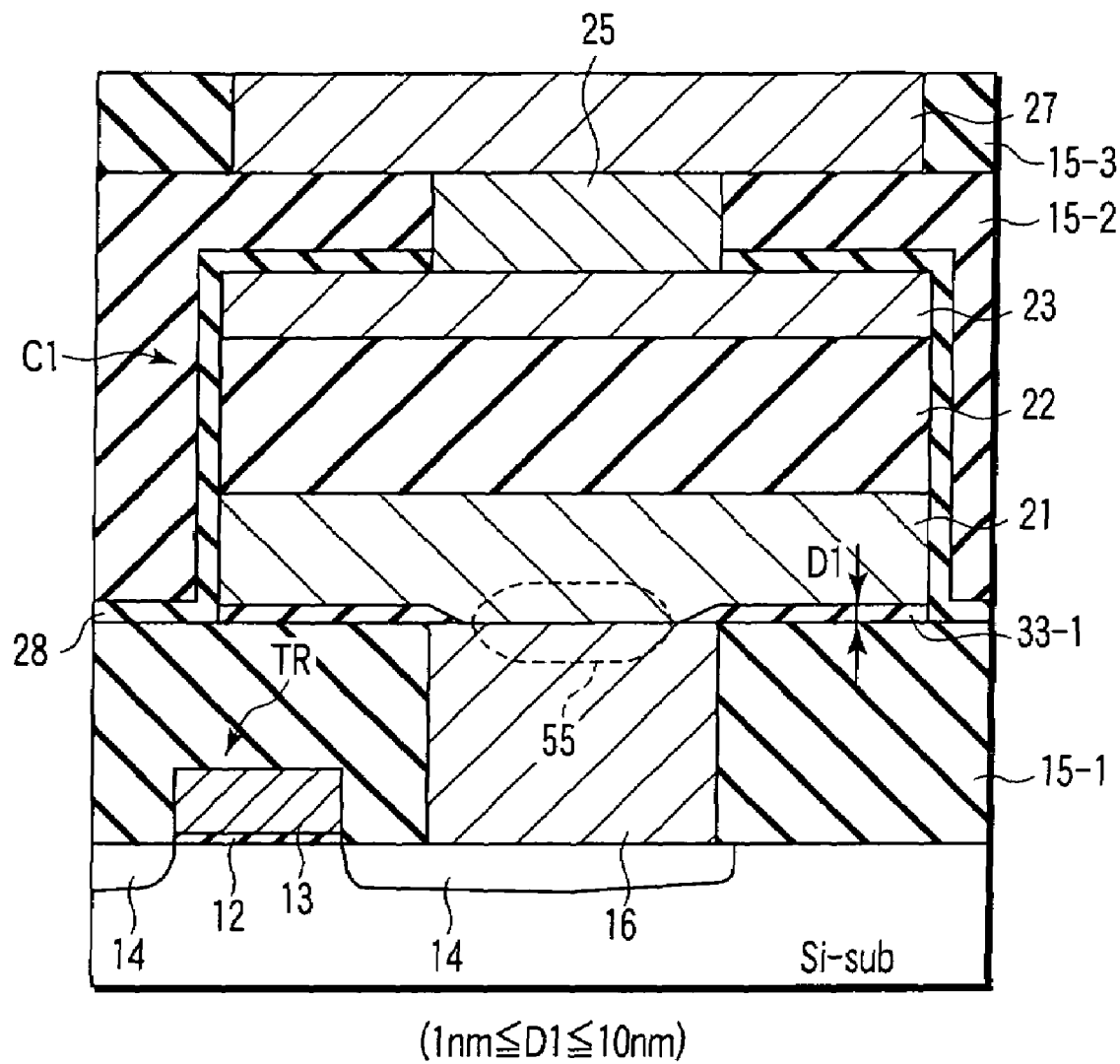
FIG. 9 is a cross-sectional view that shows a semiconductor device according to a second embodiment of the present invention.

Next, a semiconductor device and a manufacturing method thereof according to a second embodiment of the invention are described referring to FIG. 9. FIG. 9 is a cross-sectional view that shows the semiconductor device according to the second embodiment. A description of the parts that are common to those in the first embodiment is omitted here.

As is shown in FIG. 9, the second embodiment differs from the first embodiment in that substantially no adhesive film is formed on the lower contact plug 16, and there is provided a portion (direct contact) 55 with a greater contact area than the portions 30-1 and 30-2 shown in the first embodiment, where the capacitor electrode 21 directly contacts the contact plug 16.

As regards the manufacturing method, the second embodiment differs from the first embodiment in that when the Ti film 35 is formed, the thickness of the Ti film 35 is set to be less than the film thickness D4 in the first embodiment (e.g. about 1 nm).

According to the semiconductor device and the manufacturing method thereof according to the second embodiment, the same advantageous effects as the above-described advantageous effects (1) to (4) can be obtained.

In addition, substantially no adhesive film is formed on the lower contact plug 16, and there is provided the direct contact 55 with a greater contact area than the portions 30-1 and 30-2, where the capacitor electrode 21 directly contacts the contact plug 16.

Therefore, the conductivity between the capacitor electrode 21 and contact plug 16 can further be enhanced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   an insulation film that is provided on a semiconductor substrate;
   a first contact plug that is provided in the insulation film and includes a metal;
   a first adhesive film that is provided on the insulation film, has a higher oxygen affinity than the metal, and includes an oxide;
   a second adhesive film that is provided on the first contact plug and has a film thickness that is smaller than a film thickness of the first adhesive film;
   a first capacitor electrode that is provided on the contact plug and the first adhesive film, has a part in direct contact with the first contact plug;
   a capacitor insulation film that is provided on the first capacitor electrode; and
   a second capacitor electrode that is provided on the capacitor insulation film.

2. The semiconductor device according to claim 1, wherein the first adhesive film has a film thickness that is between 1 nm and 10 nm.

3. The semiconductor device according to claim 1, further comprising:
   a gate-insulated field-effect transistor that is provided on the semiconductor substrate and has a current path with one end electrically connected to the first contact plug.

4. The semiconductor device according to claim 1, further comprising:
   a barrier film that is provided to cover surfaces of the first capacitor electrode, the second capacitor electrode and the capacitor insulation film.

5. The semiconductor device according to claim 4, further comprising:
   a second contact plug that penetrates the barrier film on the second capacitor electrode and is electrically connected to the second capacitor electrode.

6. The semiconductor device according to claim 5, further comprising:
   a plate line that is electrically connected to the second contact plug.

7. The semiconductor device according to claim 3, wherein the gate-insulated field-effect transistor comprises:
   a gate insulation film that is provided on the semiconductor substrate;
   a gate electrode that is provided on the gate insulation film; and
   a source and a drain that are provided spaced apart in the semiconductor substrate, the gate being interposed between the source and the drain.

8. The semiconductor device according to claim 1, wherein the metal includes W,
   the first adhesive film includes Ti, and
   the first capacitor electrode includes Ir.

9. The semiconductor device according to claim 1, wherein the first capacitor electrode has a film thickness that is between 40 nm and 200 nm.

* * * * *